(12) United States Patent
Maetani

(10) Patent No.: US 8,013,427 B2
(45) Date of Patent: Sep. 6, 2011

(54) WIRING BOARD AND ELECTRICAL SIGNAL TRANSMISSION SYSTEM

(75) Inventor: Maraki Maetani, Kyoto (JP)

(73) Assignee: Kyocera Corporation, Kyoto (JP)

(*) Notice: Subject to any disclaimer, the term of this patent is extended or adjusted under 35 U.S.C. 154(b) by 190 days.

(21) Appl. No.: 12/548,371

(22) Filed: Aug. 26, 2009

(65) Prior Publication Data
US 2009/0315158 A1 Dec. 24, 2009

Related U.S. Application Data

(63) Continuation-in-part of application No. PCT/JP2008/053450, filed on Feb. 27, 2008.

(30) Foreign Application Priority Data

Feb. 27, 2007 (JP) ................. 2007-048090
Oct. 31, 2007 (JP) ................. 2007-284054

(51) Int. Cl.
*H01L 23/58* (2006.01)
*H05K 1/11* (2006.01)
(52) U.S. Cl. .......... 257/664; 257/E23.01; 174/261
(58) Field of Classification Search .......... 257/664, 257/773, E23.01; 174/258, 261
See application file for complete search history.

(56) References Cited

U.S. PATENT DOCUMENTS

| | | | |
|---|---|---|---|
| 6,486,755 B2 | 11/2002 | Aruga | |
| 6,700,789 B2* | 3/2004 | Shirasaki | 361/748 |
| 7,190,188 B2 | 3/2007 | Otsuka et al. | |
| 2001/0013075 A1 | 8/2001 | Otsuka et al. | |
| 2002/0041009 A1 | 4/2002 | Yamaguchi et al. | |
| 2004/0189418 A1 | 9/2004 | Bartley et al. | |

FOREIGN PATENT DOCUMENTS

| | | |
|---|---|---|
| DE | 4326989 A1 | 3/1994 |
| JP | 2001-211211 | 8/2001 |
| JP | 2002-84108 | 3/2002 |
| JP | 2002-141711 | 5/2002 |
| JP | 2004-014800 | 1/2004 |
| JP | 2004-304233 A | 10/2004 |
| JP | 2005-51496 | 2/2005 |

* cited by examiner

*Primary Examiner* — Matthew W Such
*Assistant Examiner* — Monica D Harrison
(74) *Attorney, Agent, or Firm* — Birch, Stewart, Kolasch & Birch, LLP

(57) ABSTRACT

A wiring board equipped with differential lines which compensate for differences in via lengths to minimize signal deterioration is disclosed. Two conductors are couple to different substrate levels through vias of different lengths. Compensation means are provided to correct for the phase difference caused by the different lengths.

16 Claims, 16 Drawing Sheets

WIRING BOARD AND ELECTRICAL SIGNAL TRANSMISSION SYSTEM

CROSS-REFERENCE TO RELATED APPLICATION

This application is a continuation in part based on PCT Application No. JP2008/053450, filed Feb. 27, 2008, which claims the benefit of Japanese Application No. 2007-048090, filed on Feb. 27, 2007, and Japanese Application No. 2007-284054, filed Oct. 31, 2007, all entitled "WIRING BOARD, ELECTRICAL SIGNAL TRANSMISSION SYSTEM AND ELECTRONIC DEVICE," the content of which are incorporated by reference herein in their entirety.

FIELD OF THE INVENTION

Embodiments of the present disclosure relate generally to wiring boards, and more particularly relate to differential circuits.

BACKGROUND

A wiring board may be used for mounting a semiconductor integrated circuit that is operated at high speed. A wiring board equipped with a differential circuit for transmitting a high frequency signal at high speed has been conventionally known. In a wiring board, a pair of differential lines can be configured in the wiring board at predetermined intervals in depth. The pair of differential lines may be electrically connected to a pair of surface layer line conductors provided on the main surface of the wiring board respectively via a pair of penetration conductors (vias) penetrating a thickness direction of the wiring board.

However, the heights of each of the penetration conductors are different from each other because they must penetrate the wiring board to different depths. Signals transmitted through the penetration conductors will travel different distances, and thus will have different transmission delay times (skew). When transmitting a differential signal, the different transmission delay times will cause each of the two signals to be out of phase, and transmission quality is deteriorated.

Accordingly, there is a need for a wiring board equipped with differential lines which reduce signal deterioration.

SUMMARY

A wiring board equipped with differential lines which compensate for differences in via lengths to minimize signal deterioration is disclosed. Two conductors are couple to different substrate levels through vias of different lengths. Compensation means are provided to correct for the phase difference caused by the different lengths.

A first embodiment comprises a wiring board. The wiring board comprises a dielectric substrate, and a first line comprising a first line conductor formed in the dielectric substrate and a first via conductor formed from one end of the first line conductor to a first main surface of the dielectric substrate. The wiring board further comprises a second line comprising a second line conductor formed in the dielectric substrate, a part of the second line conductor being aligned with the first line conductor. The second line also comprises an electric signal having opposite phase to an electric signal supplied to the first line conductor being supplied to the second line conductor, and a second via conductor formed from one end of the second line conductor to the first main surface of the dielectric substrate, the second via conductor being longer than the first via conductor, an electrical length of the second line being equal to an electrical length of the first line.

A second embodiment comprises an electric signal transmission system. The electric signal transmission system comprises a wiring board. The wiring board comprises a dielectric substrate, and a first line comprising a first line conductor formed in the dielectric substrate and a first via conductor formed from one end of the first line conductor to first main surface of the dielectric substrate. The first line further comprises a first surface layer line conductor provided along the first main surface of the dielectric substrate. The wiring board further comprises a second line comprising a second line conductor formed in the dielectric substrate, a part of the second line conductor being aligned with the first line conductor. The second line also comprises an electric signal having opposite phase to an electric signal supplied to the first line conductor being supplied to the second line conductor, and a second via conductor formed from one end of the second line conductor to the first main surface of the dielectric substrate, the second via conductor being longer than the first via conductor, an electrical length of the second line being equal to an electrical length of the first line. The second line further comprises a second surface layer line conductor provided along the first main surface of the dielectric substrate, a part of the second surface layer line conductor being aligned with the first surface layer line conductor. One end of the first surface layer line conductor is electrically connected to the first via conductor, and one end of the second surface layer line conductor is electrically connected to the second via conductor. The electric signal transmission system further comprises a second via conductor formed from one end of the second line conductor to the first main surface of the dielectric substrate, the second via conductor being longer than the first via conductor, an electrical length of the second line being equal to an electrical length of the first line. The electric signal transmission system further comprises a semiconductor integrated circuit electrically connected to the first surface layer line conductor and the second surface layer line conductor.

BRIEF DESCRIPTION OF THE DRAWINGS

Embodiments of the present disclosure are hereinafter described in conjunction with the following figures, wherein like numerals denote like elements. The figures are provided for illustration and depict exemplary embodiments of the disclosure. The figures are provided to facilitate understanding of the disclosure without limiting the breadth, scope, scale, or applicability of the disclosure. The drawings are not necessarily made to scale.

DETAILED DESCRIPTION OF EXEMPLARY EMBODIMENTS

The following description is presented to enable a person of ordinary skill in the art to make and use the embodiments of the invention. The following detailed description is exemplary in nature and is not intended to limit the invention or the application and uses of the embodiments of the invention. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the invention. Furthermore, there is no intention to be bound by any expressed or implied theory presented in the preceding technical field, background, brief summary or the following detailed description. The present invention should be accorded scope consistent with the claims, and not limited to the examples described and shown herein.

Embodiments of the invention are described herein in the context of practical non-limiting applications, namely, a circuit board. Embodiments of the invention, however, are not limited to such circuit board applications, and the techniques described herein may also be utilized in other electrical circuit applications. For example, embodiments may be applicable to integrated circuits and the like.

As would be apparent to one of ordinary skill in the art after reading this description, these are merely examples and the embodiments of the invention are not limited to operating in accordance with these examples. Other embodiments may be utilized and structural changes may be made without departing from the scope of the exemplary embodiments of the present invention.

Figure 1:
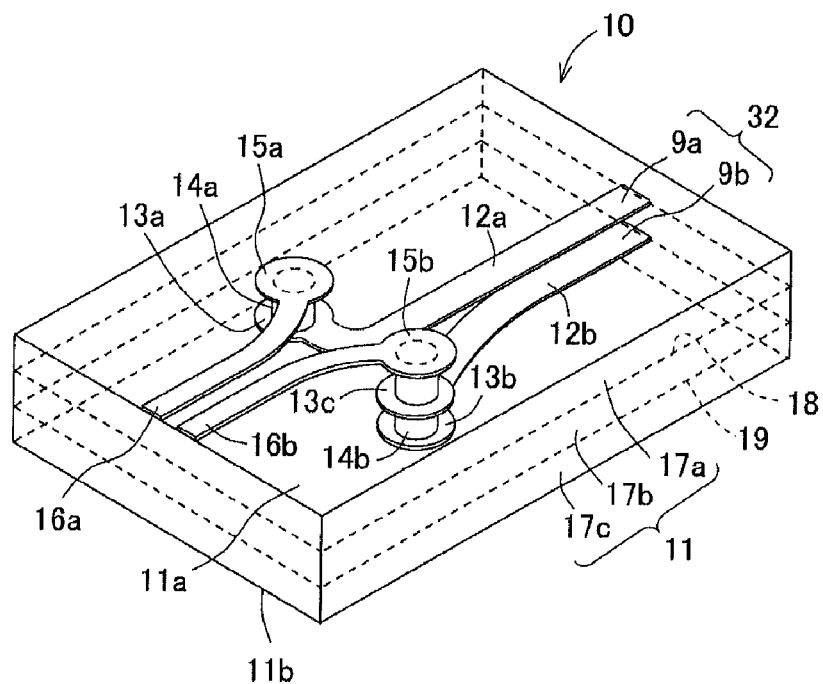
FIG. 1 illustrates an external perspective view of an exemplary wiring board according to an embodiment of the present disclosure.
Figure 2:
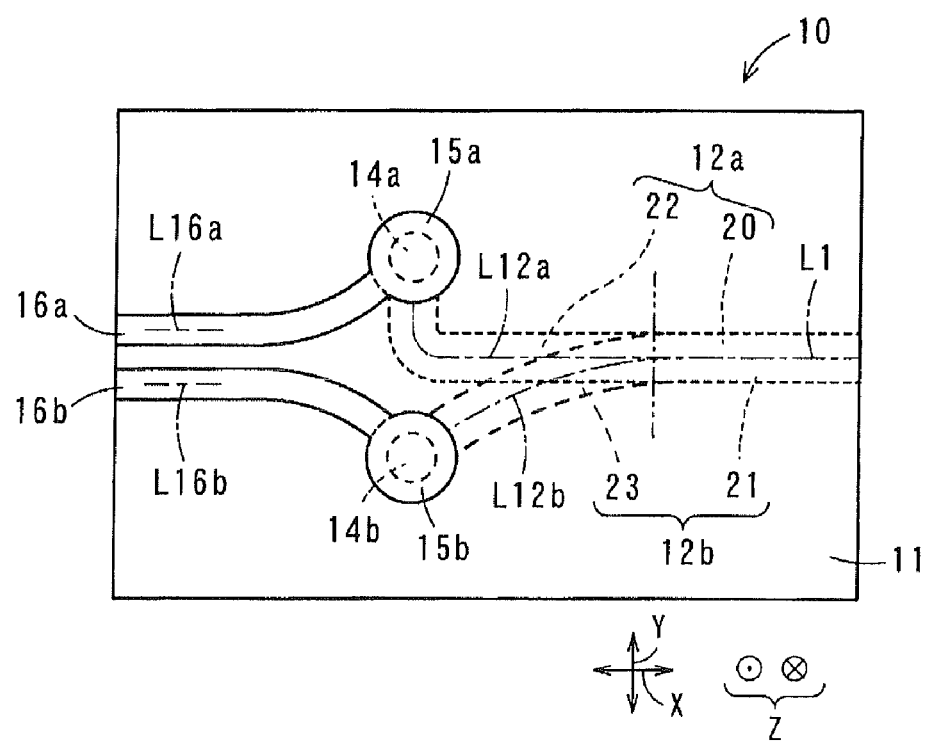
FIG. 2 illustrates a schematic top plan view of the wiring board shown in FIG. 1.

FIG. 1 illustrates a perspective view of an exemplary wiring board according to an embodiment of the present invention. FIG. 2 illustrates a schematic top plan view of a wiring board 10 shown in FIG. 1.

The wiring board 10 comprises a dielectric substrate 11, a pair of inner layer line conductors 12a and 12b (first line conductor 12a, and second line conductor 12b), three inner layer lands 13a to 13c, a pair of penetration conductors 14a and 14b (penetration conductor 14a, and penetration conductor 14b), a pair of surface layer lands 15a and 15b (surface layer land 15a, and surface layer land 15b), and a pair of surface layer line conductors 16a and 16b (first surface layer line conductor 16a and second surface layer line conductor 16b).

In FIG. 1, for the sake of easy understanding, the dielectric substrate 11 is seen through and the inner structure such as the inner layer line conductors 12a and 12b is shown by solid lines. A first line 9a comprises the inner layer line conductor 12a, the inner layer land 13a, the penetration conductor 14a, the surface layer land 15a, and the surface layer line conductor 16a. A second line 9b comprises the inner layer line conductor 12b, inner layer land 13b, the penetration conductor 14b, residual inner layer land 13c, the surface layer land 15b, and the surface layer line conductor 16b.

A differential line 32 comprises the first line 9a and the second line 9b. The dielectric substrate 11 is equipped with at least three dielectric layers 17a to 17c (first layer 17a, intermediate layer 17b, and third layer 17c). The pair of inner layer line conductors (first line conductor 12a and second line conductor 12b) are respectively positioned along upper surface 18 (first virtual plane, predetermined first virtual plane) and lower surface 19 (predetermined third virtual plane) of the intermediate layer 17b.

Hereinafter, the laminated direction of the three dielectric layers 17a to 17c of the dielectric substrate 11 is referred to as the thickness direction Z. Further, among the directions perpendicular to the thickness direction Z of the dielectric substrate 11, the direction extending along the long side of the dielectric substrate 11 when projected on a project plane perpendicular to the thickness direction Z is referred to as longitudinal direction X. Further, the direction perpendicular to both of the thickness direction Z and the longitudinal direction X is referred to as width direction Y.

The intermediate layer 17b is positioned at the center of the three dielectric layers 17a to 17c in the thickness direction Z. Among the pair of inner layer line conductors 12a and 12b, the inner layer line conductor 12a provided at the upper side in the thickness direction Z is the first line conductor 12a, and the inner layer line conductor 12b provided at the lower side in thickness direction Z is the second line conductor 12b.

The first line conductor 12a is positioned in the dielectric substrate 11. For example, the first line conductor 12a extends along the upper surface 18 of the intermediate layer 17b that functions as a predetermined first virtual plane 18. Further, the second line conductor 12b is positioned in the dielectric substrate 11. For example, the second line conductor 12b extends along the lower surface 19 of the intermediate layer 17b that functions as a predetermined third virtual plane 19. Assuming that one of the surfaces of the dielectric substrate 11 at the upper side is a first main surface 11a, the second line conductor 12b is positioned at a side of a second main surface 11b which is the lower surface 11b of the dielectric substrate 11, which is lower than the first line conductor 12a. The upper and lower surfaces 18, 19 of the intermediate layer 17b are approximately parallel to each other. Herewith, a part of the second line conductor 12b is approximately parallel with the first line conductor 12a.

For example, as show in FIG. 1, it is preferable that the distance between the first line conductor 12a and the second line conductor 12b is constant in the thickness direction Z. In order to provide the line conductors so as to be parallel to each other, it is necessary that the distance is constant regardless of the thickness direction Z. Note that the word "parallel" used in this document comprises "parallel" and "substantially parallel". "Substantially parallel" means that the relationship is deviated from parallel by a level within which effects obtained by the embodiments of the invention are not influenced.

In FIG. 1, the first line conductor 12a and the second line conductor 12b comprise an overlapped portion when viewed from the thickness direction Z. The overlapped portion extends along the longitudinal direction X. The differential line 32 includes the pair of inner layer line conductors 12a and 12b including the first line conductor 12a and the second line conductor 12b. The main part of the pair of inner layer line conductors 12a and 12b functions as the differential line 32 having constant differential impedance by comprising a uniform opposed structure in which the intermediate layer 17b is interposed therebetween.

The inner layer lands 13a and 13b are provided at respective ends of the pair of inner layer line conductors 12a and 12b. The inner layer land 13a is coupled to the first line conductor 12a and is provided along the upper surface 18 of the intermediate layer 17b. Further, the inner layer land 13b is coupled to the second line conductor 12b and is provided along the lower surface 19 of the intermediate layer 17b. With the inner layer lands 13a and 13b, connection reliability between the pair of inner layer line conductors 12a and 12b and the pair of penetration conductors 14a and 14b can be assured. The inner layer land 13a is coupled to the first line conductor 12a, and the inner layer land 13b is coupled to the second line conductor 12b. The inner layer land 13a and the inner layer land 13b are positioned at approximately the same position in the longitudinal direction X when viewed from the thickness direction Z, and are provided to have an interval in the width direction Y. In this embodiment, the inner layer land 13a coupled to the first line conductor 12a and the inner layer land 13b connected to the second line conductor 12b are disposed at positions that are approximately linear symmetry with respect to the axis line L1 of the portion at which the pair of inner layer line conductors 12a and 12b are overlapped (see FIG. 2). Further, the residual inner layer land 13c is positioned along the upper surface 18 of the intermediate layer 17b, and provided at the vicinity of just above the inner layer land 13b connected to the second line conductor 12b. In this embodiment, the three inner layer lands 13a to 13c are formed to have approximately the same shape and size to each other, and for example, formed to have a circular shape.

Ends of the pair of penetration conductors 14a and 14b are coupled to the inner layer lands 13a and 13b respectively. The inner layer lands 13a and 13b are connected to the pair of inner layer line conductors 12a and 12b respectively. A pair of the penetration conductors 14a (first via conductor) and 14b (second via conductor) are provided to extend to a second virtual surface that is closer to the first main surface 11a of the dielectric substrate 11 than the upper surface 18 (first virtual plane 18) of the intermediate layer 17b. In this embodiment, the second virtual surface is set at the first main surface 11a of the dielectric substrate 11. Accordingly the pair of the penetration conductors 14a and 14b are provided to extend from the pair of the inner layer line conductors 12a and 12b to the first main surface 11a of the same surface layer which is the first main surface 11a of the dielectric substrate 11. Among the pair of penetration conductors 14a and 14b, the penetration conductor that is provided from the first main surface 11a of the dielectric substrate 11 to one end of the first line conductor 12a and that is electrically coupled to the first line conductor 12a is the first via conductor 14a. Further, among the pair of penetration conductors 14a and 14b, the penetration conductor that is provided from the first main surface 11a of the dielectric substrate 11 to one end of the second line conductor 12b and that is electrically coupled to the second line conductor 12b is the second via conductor 14b. The second via conductor 14b is provided from the inner layer land 13b whose one end is provided on the lower surface 19 of the intermediate layer 17b to the first main surface 11a of the dielectric substrate 11 via the inner layer land 13c provided on the upper surface 18 of the intermediate layer 17b. In this manner, since the second via conductor 14b is provided via the inner layer land 13c positioned at the upper surface 18 of the intermediate layer 17, connection reliability to the first main surface 11a of the dielectric substrate 11 can be improved. In this embodiment, each of the pair of penetration conductors 14a and 14b is formed to have a cylinder shape extending along the thickness direction Z, and is formed to have approximately the same cross sectional shape and size.

The pair of surface layer lands 15a and 15b are provided along the first main surface 11a of the dielectric substrate 11, and are respectively electrically coupled to the other ends of the pair of penetration conductors 14a and 14b. A pair of surface layer line conductors 16a (first surface layer line conductor) and 16b (second surface layer line conductor) are provided along the first main surface 11a of the dielectric substrate 11, and respectively electrically connected to the pair of surface layer lands 15a and 15b. In this embodiment, the shape and the size of the pair of surface layer lands 15a and 15b are formed so as to be approximately the same, and for example but without limitation, formed in a circular plate shape. The cross sections of the penetration conductors 14a and 14b in the thickness direction Z are formed smaller than the cross sections of the three inner layer lands 13a, 13b and 13c and the cross sections of the pair of surface layer lands 15a and 15b. Herewith, when the penetration conductors 14a and 14b are formed, even when the positions of the penetration conductors 14a and 14b are misaligned with respect to the three inner layer lands 13a, 13b and 13c and the pair of surface layer lands 15a and 15b, the penetration conductors 14a and 14b, and the three inner layer lands 13a, 13b and 13c and the pair of surface layer lands 15a and 15b which should be coupled therewith can be coupled, and reliability can be improved.

Among the pair of surface layer line conductors 16a and 16b, the surface layer line conductor whose one end is electrically coupled to the first via conductor 14a is the first surface layer line conductor 16a. Further, among the pair of surface layer line conductors 16a and 16b, the surface layer line conductor whose one end is electrically connected to the second via conductor 14b is the second surface layer line conductor 16b. At least a part of a center line L16a of the first surface layer conductor 16a and at least a part of a center line L16b of the second surface layer line conductor 16b are provided so as to be approximately parallel. As shown in FIG. 2, the pair of surface layer line conductors 16a and 16b is formed to bend closer to each other and apart from each of the pair of surface layer lands 15a and 15b. In this manner, the pair of surface layer line conductors 16a and 16b can extend to be approximately parallel to each other along a predetermined direction. The predetermined direction may be the longitudinal direction X in this embodiment, when the distance between the center lines L16a and L16b thereof becomes not less than a predetermined distance.

The pair of surface layer line conductors 16a and 16b constitutes the differential line 32. In this embodiment, the electrical lengths of the surface layer line conductors 16a and 16b are selected to be equal to each other. Herein, the cross sectional shapes and the sizes of the surface layer line conductors 16a and 16b are selected to be equal to each other, and the line lengths of the first and second surface layer line conductors 16a and 16b are selected to be equal.

The dielectric substrate 11 may be made from, for example but without limitation, an inorganic material or a resin material. The inorganic material, may comprise, for example but without limitation, alumina (Al$_2$O$_3$) ceramics, mullite (3Al$_2$O$_3$.2SiO$_2$) ceramics, glass ceramics, and the like. The resin material, may comprise, for example but without limitation, a fluorine resin, a glass epoxy resin, a polyphenylene ether (PPE) resin, liquid crystalline polyester (LCP), polyimide (PI), and the like. The shape and the size of the dielectric substrate 11 are appropriately set in accordance with the application. Particularly, the thickness is set depending on the frequency of transmission signal or impedance design.

The material of the conductor wirings such as the pair of inner layer line conductors 12a and 12b, the inner layer lands 13a to 13c, the pair of surface layer lands 15a and 15b, the pair of surface layer line conductors 16a and 16b, is constituted by a conductor layer of a metal suited for the application of high speed signal transmission. For example, ceramics can be used as the material of the dielectric substrate 11. The ceramics may comprise, for example but without limitation, copper, molybdenum-manganese, tungsten, and the like which, for example, can be used to form the conductor lines. Method of manufacturing of the dielectric substrate 11 comprises for example but without limitation, a thick film print method, various thin film forming methods, a plating method, and the like. The width and the thickness of each conductor wiring is set depending on the frequency of transmission signal or impedance design.

The wiring board 10 of the embodiment is manufactured, for example, as described below. When the three dielectric layers 17a to 17c are constituted by, for example but without limitation, alumina ceramics, green sheets of alumina ceramics are prepared, which becomes the three dielectric layers 17a to 17c. Through holes for providing the pair of penetration conductors 14a and 14b are formed by performing a predetermined blanking processing thereto. Then, a conductor paste such as, for example but without limitation, tungsten, molybdenum, or the like is filled in the through holes by a screen printing method. Patterns of the conductor wiring are printed by the screen printing method and applied at predetermined positions of the three dielectric layers 17a to 17c. Then, the three dielectric layers 17a to 17c on which the pattern is formed are overlapped and the layers are burned at 1600 degrees. Then, the wiring board 10 of this embodiment can be manufactured, for example but without limitation, by performing a nickel plating and gold plating on the exposed pair of the surface layer line conductors 16a and 16b.

Next, the first line conductor 12a and the second line conductor 12b are explained in detail. The electrical length of the first line conductor 12a is set larger than the electrical length of the second line conductor 12b. Further, the pair of inner layer line conductors 12a and 12b is formed to have, for example, band shapes whose cross sectional shapes and the sizes are approximately equal to each other. In this embodiment, the pair of inner layer line conductors 12a and 12b has approximately the same cross sectional shape to each other. Consequently, in order to set the electrical length of the first line conductor 12a so as to be larger than the electrical length of the second line conductor 12b, line length of the first line conductor 12a is set larger than line length of the second line conductor 12b.

The first line conductor 12a is equipped with a first line parallel portion 20 in which a center line L12a of the first line conductor 12a and a center line L12b of the second line conductor 12b are approximately parallel, and a residual first line separation portion 22. The second line conductor 12b is equipped with a second line parallel portion 21 in which the center line L12a of the first line conductor 12a and the center line L12b of the second line conductor 12b are approximately parallel, and a residual second line separation portion 23. In this embodiment, the center line of the first line parallel portion 20 and the center line of the second line conductor 12b are disposed (at approximately the same position) so as to be overlapped in plan view (when viewed from the thickness direction Z). Since the widths of the pair of inner layer line conductors 12a and 12b are approximately same as each other, as shown in FIG. 2, the first line parallel portion 20 and the second line parallel portion 21 are disposed at approximately the same position when viewed from the thickness direction Z. One end of the residual first line separation portion 22 is electrically coupled to the first via conductor 14a. Further, one end of the residual second line separation portion 23 is electrically connected to the second via conductor 14b.

The electrical length of the first line parallel portion 20 is set equal to the electrical length of the second line parallel portion 21. In this embodiment, the "electrical length" can be rephrased by the length of the line in the case where the cross sectional shapes and the sizes of the lines are the same. The length of the line is the length from an exterior electrical input/output portion to another external electrical input/output portion. Notably, even when the cross sectional shapes or the sizes of the lines whose electrical lengths are compared are not the same, it is possible to compare the electrical lengths of the two lines by comparing phase changes from input portions to output portions of the two lines to be compared. Specifically, electric signals having the same phase are input to the input portions of the two lines, and phase sizes changed from the input portions are respectively compared at each of the output portions. When the changed phase sizes are the same, the electrical lengths are the same. In this document, "electrical lengths are equal" means that the difference of the lengths of two conductors of differential line is within the range of 5% of pulse width (or frequency of analog wave). In this embodiment, the pair of inner layer line conductors 12a and 12b have the approximately the same cross sectional shape and size. Consequently, in order to set the electrical length of the first line parallel portion 20 and the electrical length of the second line parallel portion 21 so as to be equal, the line length of the first line parallel portion 20 and the line length of the second line parallel portion 21 are set so as to be approximately the same length. Further, the electrical length of the residual first line separation portion 22 is set larger than the electrical length of the residual second line separation portion 23.

In other words, a first electrical length is from an end of a part in which an opposing structure of the differential line 32 is uniform with the first line conductor 12a provided on the upper surface 18 of the intermediate layer 17b. A second electrical length is from an end of a part in which an opposing structure of the differential line 32 is uniform with the second line conductor 12b provided on the lower surface 19 of the intermediate layer 17b. The first electrical length is set larger than the second electrical length.

As shown in FIG. 2, the residual first line separation portion 22 and the residual second line separation portion 23 are provided so as to be bent in the directions to be separated to each other, i.e., bent toward the width direction Y, and so as to extend toward the corresponding inner layer lands 13a, 13b. The curvature of the residual first line separation portion 22 is set smaller than the curvature of the residual second line separation portion 23. By setting the curvature of the residual second line separation portion 23 so as to be smaller than the curvature of the residual second line separation portion 23, the line length of the residual first line separation portion 22 can be set larger than the line length of the residual second line separation portion 23.

Further, in this embodiment, a total electrical length of the residual first line separation portion 22 and the first via conductor 14a and a total electrical length of the residual second line separation portion 23 and the second via conductor 14b are set to be equal, and the electrical length of the first line 9a and the electrical length of the second line 9b are set to be equal. In the wiring board 10 of FIG. 1, the length of the second via conductor 14b connected to the second line conductor 12b provided on the lower surface 19 of the intermediate layer 17b via the inner layer land 13b is longer than the length of the first via conductor 14a connected to the first line conductor 12a provided on the upper surface 18 of the intermediate layer 17b via the inner layer land 13a by the thickness of the intermediate layer 17b. The pair of inner layer line conductors 12a, 12b has approximately the same cross sectional shape to each other, and the first via conductor 14a and the second via conductor 14b have approximately the same cross sectional shape and size to each other. In order to set the total electrical length of the residual first line separation portion 22 and the first via conductor 14a and the total electrical length of the residual second line separation portion 23 and the second via conductor 14b so as to be equal, the total line length of the residual first line separation portion 22 and the first via conductor 14a and the total line length of residual second line separation portion 23 and the second via conductor 14b are set so as to be equal. In other words, the difference between the electrical length of the residual first line separation portion 22 and the length of the residual second line separation portion 23 is set equal to the difference of the line lengths of the first via conductor 14a and the second via conductor 14b. Accordingly, the curvature of the residual first line separation portion 22 and the curvature of the residual second line separation portion 23 are set based on the difference of the line lengths of the first via conductor 14a and the second via conductor 14b.

The first line conductor 12a and the second line conductor 12b are provided along the upper and lower surfaces 18 and 19 of the intermediate layer 17b. A height of the first via conductor 14a is smaller than a height of the second via conductor 14b. In this embodiment, the electrical length of the first line conductor 12a is set larger than the electrical length of the second line conductor 12b. Accordingly, since the electrical length of the first line conductor 12 that is connected to the first via conductor 14a is set larger than the electrical length of the second line conductor 12b, the total electrical length of the first line conductor 12a and the first via conductor 14a can be set equal to the total electrical length of the second line conductor 12b and the second via conductor 14b. Herewith, skew of an electric signal generated by the difference of the electrical lengths of the first and second via conductors 14a and 14b can be restrained by the first and the second line conductors 12a and 12b. In this manner, since the electrical length of each of the first and second lines 9a and 9b as the differential line 32 can be set so as to be equal to each other, phase shift amounts of electromagnetic waves as transmission signals also become equal. Consequently, skew at an output end of the differential line 32 can be reduced, which makes it possible to restrain deterioration of the waveform quality of transmission signal.

Further, in this embodiment, the first line conductor 12a is equipped with the first line parallel portion 20 and the residual first line separation portion 22, and the second line conductor 12b is equipped with the second line parallel portion 21 and the residual second line separation portion 23. The center lines of the first line parallel portion 20 and the second line parallel portion 21 are approximately parallel, and the center lines of the residual first line separation portion 22 and the residual second line separation portion 23 are not approximately parallel. Further, one end of the residual first line separation portion 22 is electrically connected to the first via conductor 14a, and one end of the residual second line separation portion 23 is electrically coupled to the second via conductor 14b. Accordingly, an electric signal supplied to the first line parallel portion 20 is transmitted to the first vial conductor 14a via the residual first line separation portion 22. Similarly, an electric signal supplied to the second line parallel portion 21 is transmitted to the second via conductor 14b via the second line separation portion 23. The electrical length of the first line parallel portion 20 is set equal to the electrical length of the second line parallel portion 21. Consequently, generation of skew of the electric signal transmitted by the first line parallel portion 20 and the residual second line parallel portion 21 can be restrained.

Further, the electrical length of the residual first line separation portion 22 is set larger than the electrical length of the residual second line separation portion 23. Herewith, the electrical length of the residual first line separation portion 22 connected to the first vial conductor 14 whose height is smaller than that of the second via conductor 14b is set larger than the electrical length of the residual second line separation portion 23. Accordingly, the total electrical length of the residual first line separation portion 22 and the first via conductor 14a can be set equal to the total electrical length of the residual second line separation portion 23 and the second via conductor 14b. Herewith, skew of electric signal generated by the difference of the electrical lengths of the first and second via conductors 14a and 14b can be restrained only by the first and the second line conductors 12a and 12b. Skew of each electric signal output from each line conductor via each via conductor can be reduced by equalizing the electrical length of each of the first line 9a and second line 9b, which makes it possible to restrain deterioration of quality of the electric signal transmitted by each line conductor.

Further, in this embodiment, the total electrical length of the residual first line separation portion 22 and the first via conductor 14a and the total electrical length of the residual second line separation portion 23 and the second via conductor 14b are set to be equal. Herewith, skew of each electric signal output from each line conductor via each via conductor 14a and 14b can be reduced. In this manner, deterioration of the quality of the electric signal transmitted by each line conductor can be restrained.

In this embodiment, the first surface layer line conductor 16a and the second surface layer line conductor 16b provided along the first main surface 11a of the dielectric substrate 11 are further provided. One end of the first surface layer line conductor 16a is electrically connected to the first via conductor 14a. Further, one end of the second surface layer line conductor 16b is electrically connected to the second via conductor 14b. Even when the first and second lines 9a and 9b include the first and second surface layer line conductors 16a and 16b provided on the surface of the dielectric substrate 11, it becomes possible to restrain deterioration of the quality of the electric signal transmitted by each line conductor. The first and the second surface layer line conductors 16a and 16b are provided on the surface of the dielectric substrate 11. Consequently, it becomes easy to supply an electric signal to the first and second lines 9a and 9b and to connect with an external electronic apparatus such as a semiconductor integrated circuit for receiving an electric signal from the first and second lines.

Further, in this embodiment, the center line L16a of at least a part of the first surface layer line conductor 16a, and the center line L16b of at least a part of the second surface layer conductor 16b are approximately parallel. Herewith, a space for providing the first surface layer line conductor 16a and the second surface layer line conductor 16b can be reduced, and the wiring board 10 can be downsized.

Further, in this embodiment, the differential line 32 is constituted by the residual line conductors except the pair of surface layer line conductors 16a and 16b so that the electrical lengths become equal to each other.

Figure 3:
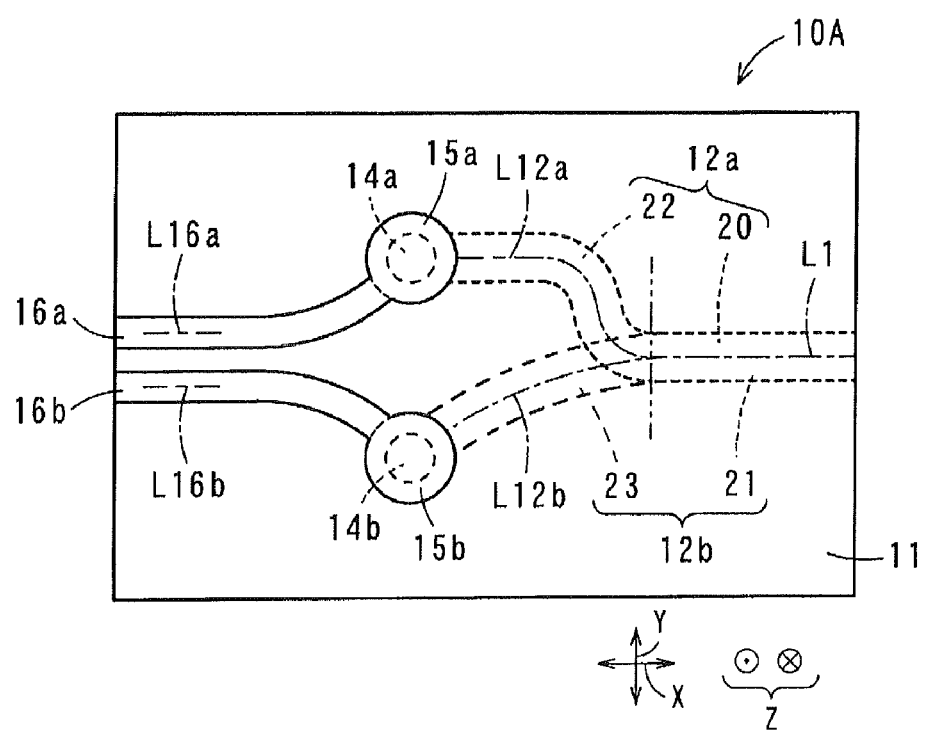
FIG. 3 illustrates a schematic top plan view of a wiring board according to one embodiment.

FIG. 3 is a plan view of a wiring board 10A according to an embodiment of the invention. In the wiring board 10A, the residual first line separation portion 22 is constituted so as to be bent toward the width direction Y, and so as to be bent toward the longitudinal direction X to extend toward the corresponding inner layer land. Also with the structure, the electrical length of the residual first line separation portion 22 can be set larger than the electrical length of the residual second line separation portion 23.

Figure 4:
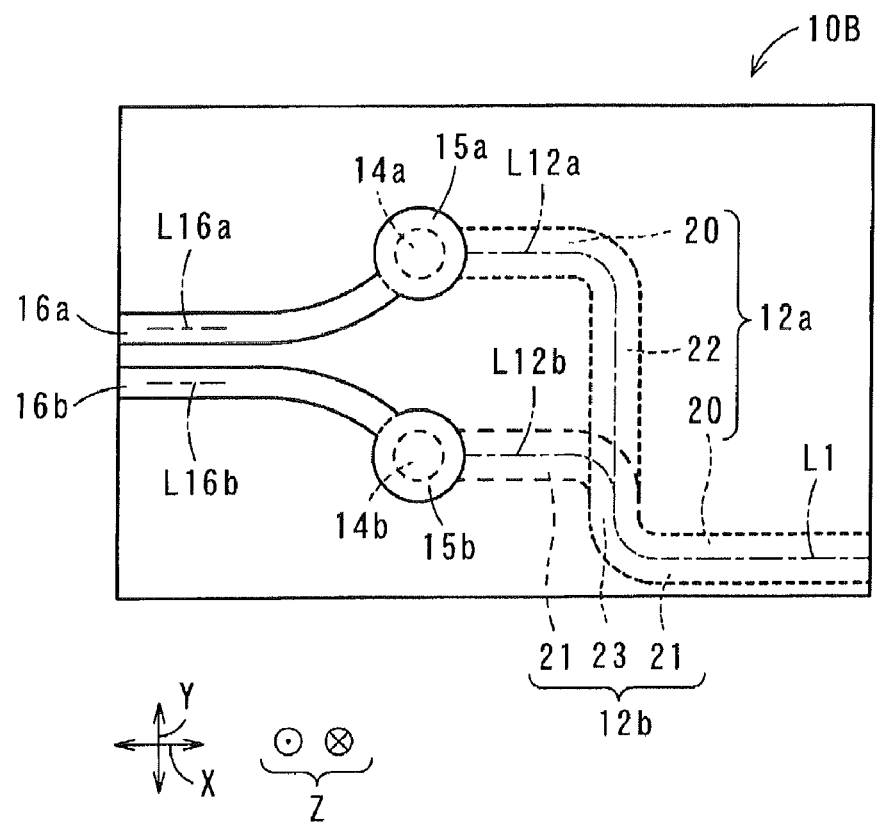
FIG. 4 illustrates a schematic top plan view of a wiring board according to one embodiment.

FIG. 4 is a plan view showing the wiring board 10B according to an embodiment of the invention. In the embodiment shown in FIG. 4, the shapes for increasing the electrical length of the first line conductor 12a than the electrical length of the second line conductor 12b are different as compared with the pair of the inner layer line conductors 12a, 12b of the first embodiment.

In this embodiment, the first line parallel portions 20 and the second line parallel portions 21 are portions having center lines extending in a predetermined direction, for example, in the longitudinal direction X. The first line parallel portions 20 and the second line parallel portions 21 are respectively formed at portions including the both ends of the first and second inner layer line conductors 12a, 12b in the extending directions. Further, the residual first line separation portion 22 and the residual second line separation portion 23 are the residual portions. Accordingly, the residual first line separation portion 22 is constituted so as to be sandwiched by the first line parallel portions 20 in the extending direction of the first inner layer line conductor 12a. The residual second line separation portion 23 is constituted so as to be sandwiched by the second line parallel portions 21 in the extending direction of the second inner layer line conductor 12b. Accordingly, the electrical length of the residual first line separation portion 22 is set larger than the electrical length of the residual second line separation portion 23. Also with the structure, the similar operations and effects as those of the wiring board 10 can be provided.

Figure 5:
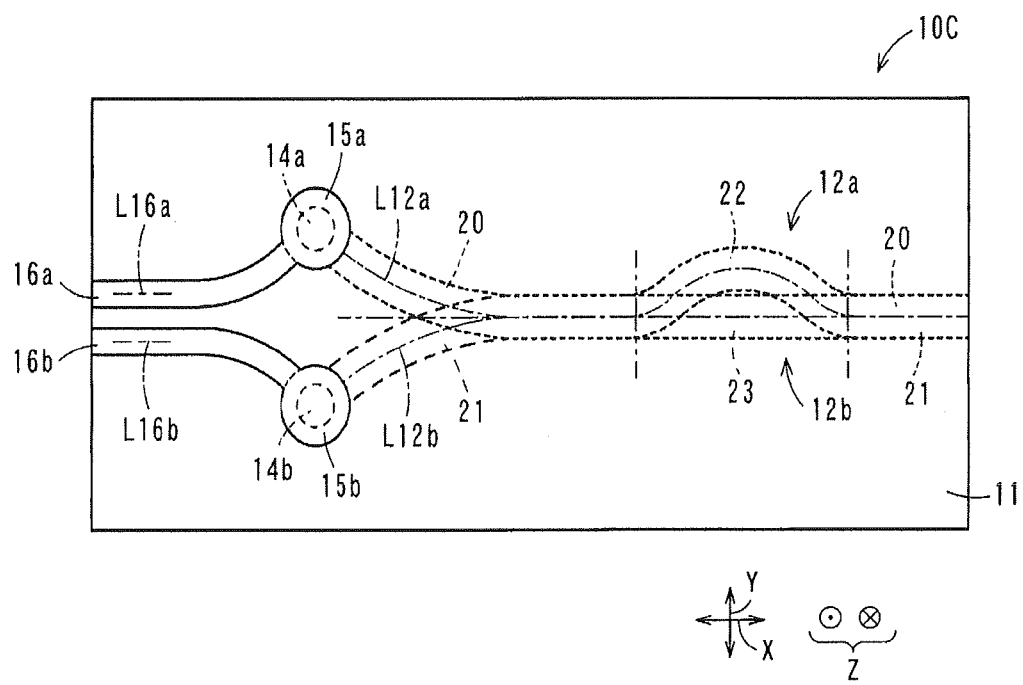
FIG. 5 illustrates a schematic top plan view of a wiring board according to one embodiment.

FIG. 5 is a plan view showing the wiring board 10C according to an embodiment of the invention. In the embodiment shown in FIG. 5, the shapes for increasing the electrical length of the first line conductor 12a than the electrical length of the second line conductor 12b are different as compared with the pair of inner layer line conductors 12a, 12b of the first embodiment.

In this embodiment, the first line parallel portions 20 and the second line parallel portions 21 are portions that are linear symmetry in a predetermined direction, for example, in the longitudinal direction X when viewed from the thickness direction Z. The residual first line separation portion 22 and the residual second line separation portion 23 are residual portions. The residual first line separation portion 22 is constituted to be sandwiched by the first line parallel portions 20. The residual second line separation portion 23 is constituted so as to be sandwiched by the second line parallel portions 21. Accordingly, the electrical length of the residual first line separation portion 22 is set larger than the electrical length of the residual second line separation portion 23. Specifically, the residual first line separation portion 22 is bent to have a convex shape with respect to the residual second line separation portion 23, and the line length of the residual first line separation portion 22 is set larger than that of the second line separation portion. Also with the structure, the similar operations and effects as those of the wiring board 10 can be provided.

Figure 6:
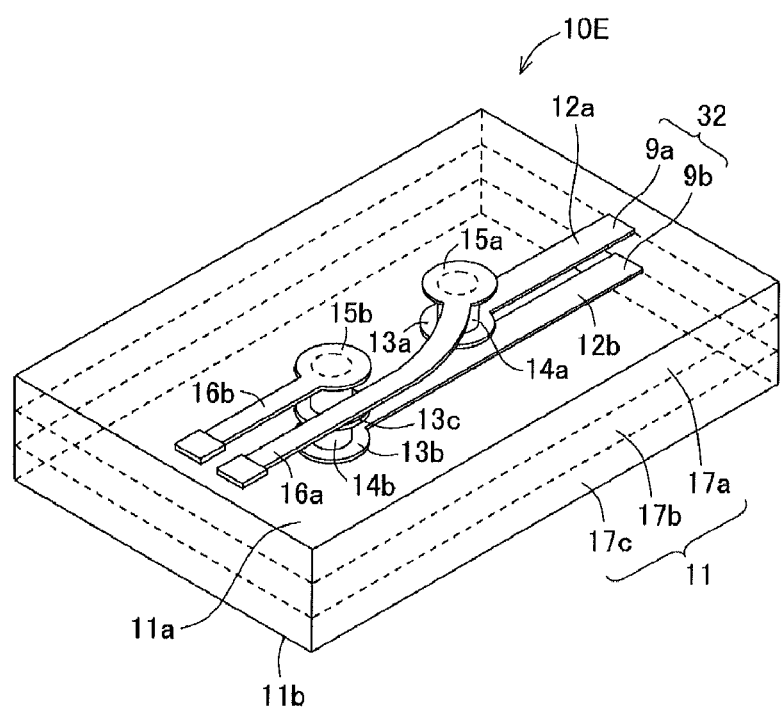
FIG. 6 illustrates a schematic external perspective view of a wiring board according to one embodiment.
Figure 7:
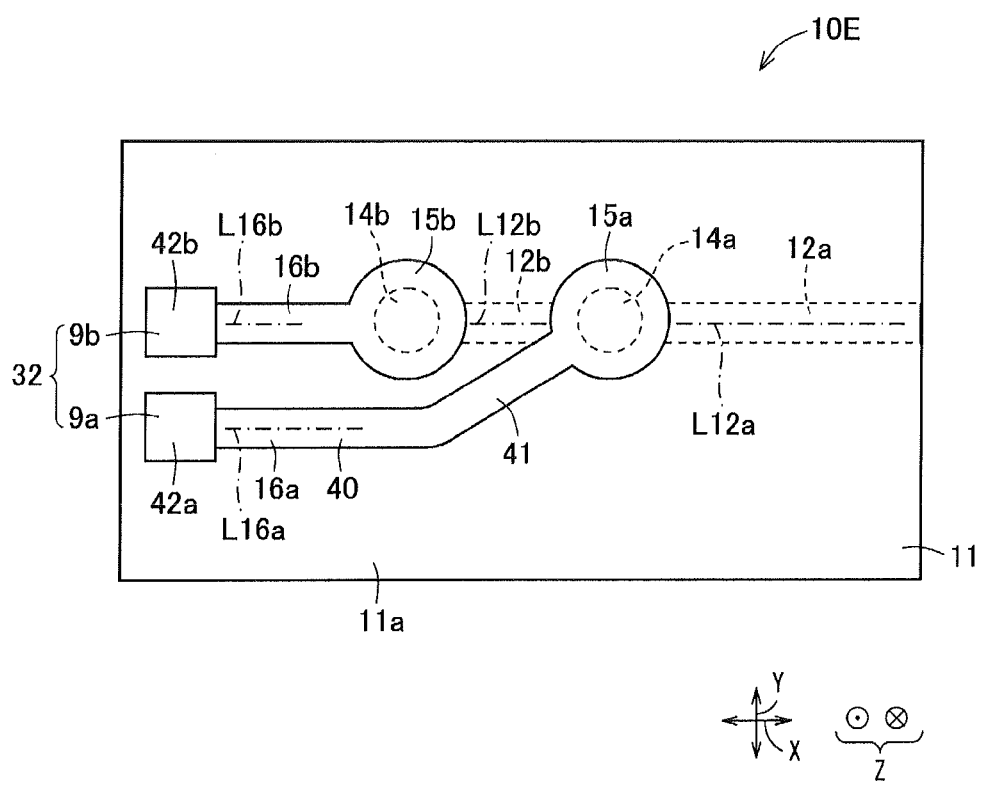
FIG. 7 illustrates a schematic top plan view of the wiring board shown in FIG. 6.

FIG. 6 is a perspective view showing the wiring board 10E according to an embodiment of the invention. FIG. 7 is a plan view showing the wiring board 10E of FIG. 6. In the embodiment, the shapes for equalizing the electrical length of the first line 9a and the electrical length of the second line 9b are different as compared with the pair of inner layer line conductors 12a and 12b and the pair of surface layer line conductors 16a and 16b of the wiring board 10.

In this embodiment, the electrical length of the first surface layer line conductor 16a is larger than the electrical length of the second surface layer line conductor 16b, and the electrical length of the first inner layer line conductor 12a is smaller than the electrical length of the second inner layer line conductor 12b. Herewith, skew of electric signal generated by the difference of the electrical lengths of the first and second via conductors 14a and 14b is restrained by the first and second inner layer line conductor 12a and 12b and the first and second surface layer line conductors 16a and 16b. With the formation of the structure, the similar effects as that of the aforementioned embodiments can be provided. In addition, degrees of freedom of drawing of the first and second lines 9a and 9b can be improved as compared with the case where skew is restrained by using only the first and second inner layer line conductors 12a and 12b, and the case where skew is restrained by using only the first and second surface layer line conductors 16a and 16b.

More specifically, the first via conductor 14a is provided with a gap from the second inner layer line conductor 12b at one side of the first main surface 11a of the second inner layer line conductor 12b. In this embodiment, the first and second inner layer line conductors 12a and 12b are formed to have straight shapes to extend in the longitudinal direction X. Further, the second surface layer conductor 16b is also formed to have a straight shape to extend in the longitudinal direction X. The first and second inner layer line conductors 12a and 12b are formed so as to be overlapped when viewed from the thickness direction Z. Further, the center lines L12a and L12b of the first and second inner layer line conductors 12a and 12b, the center line L16b of the second surface layer line conductor 16b, and the center axis lines of the first and second via conductors 14a and 14b extending in the thickness direction Z of the dielectric substrate 11 are formed to be included in a same virtual plane that is parallel to the thickness direction Z. The first surface layer line conductor 16a are formed to include a line parallel portion 40 that extends in parallel with the second surface layer line conductor 16b and a line curved portion 41 that is continued with the line parallel portion 40 and the first surface layer land 15a and that have a portion that is curved toward the surface layer land 15a from the line parallel portion 40.

The center axis line L16a of the line parallel portion 40 and the center line L16b of the second surface layer line conductor 16b are formed so as to be approximately parallel. The line curved portion 41 is curved in the direction to approach the center line L16b of the second surface layer line conductor 16b as is separated from the line parallel portion 40. A total electrical length of the line curved portion 41 and the electrical length of the first via conductor 14a is set equal to the total of the electrical length of the second via conductor 14b and the electrical length obtained by subtracting the electrical length of the first inner layer line conductor 12a from the electrical length of the second inner layer line conductor 12b.

In this embodiment, a part of the second inner layer line conductor 12b and the first via conductor 14a are overlapped in the thickness direction Z of the dielectric substrate 11, so that the space of the dielectric substrate 11 at one side of the first main surface 11a can be effectively used, and the space required for providing the first and second lines 9a, and 9b can be reduced. Further, the wiring board 10E can be downsized.

Further, connection pads 42a and 42b used for connecting with an exterior electronic apparatus are formed at the other ends of the first and second surface layer line conductors 16a and 16b. The sizes of the connection pads 42a and 42b in the width direction Y are larger than the residual parts of the first and second surface layer line conductors 16a and 16b. Herewith, it becomes easy to connect the first and second surface layer line conductors 16a and 16b and an exterior electronic apparatus such as a semiconductor integrated circuit.

Figure 8:
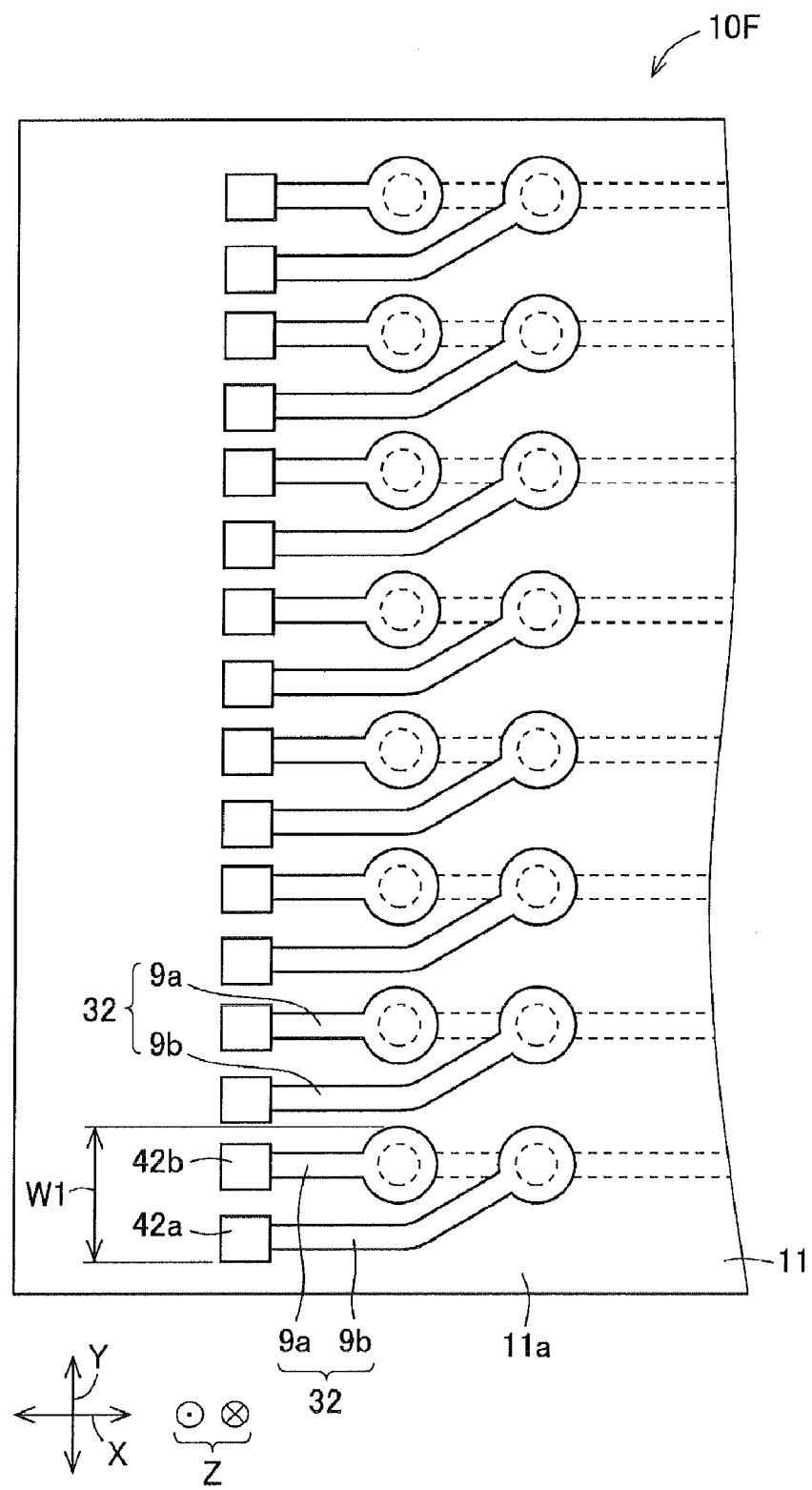
FIG. 8 illustrates a schematic top plan view of a wiring board according to one embodiment.

FIG. 8 is a plan view showing a wiring board 10F according to an embodiment of the invention. The wiring board 10F is formed by a plurality of aforementioned wiring boards 10E aligned in the width direction Y, and a plurality of differential lines 32 are provided. When each of differential lines 32 is formed like the wiring board 10E, the width W1 of a pair of differential lines 32 in the width direction Y can be reduced when the plurality of differential lines 32 are aligned in the width direction Y. Herewith, the distance between the inner layer line conductors 12a, and 12b in the width direction Y and the distance between the surface layer line conductors 16a, and 16b in the width direction Y of adjacent differential lines 32 can be reduced, and more differential lines 32 can be formed in a unit area. Accordingly, the wiring board 10F can be downsized in the case where a number of differential lines 32 are aligned.

Figure 9:
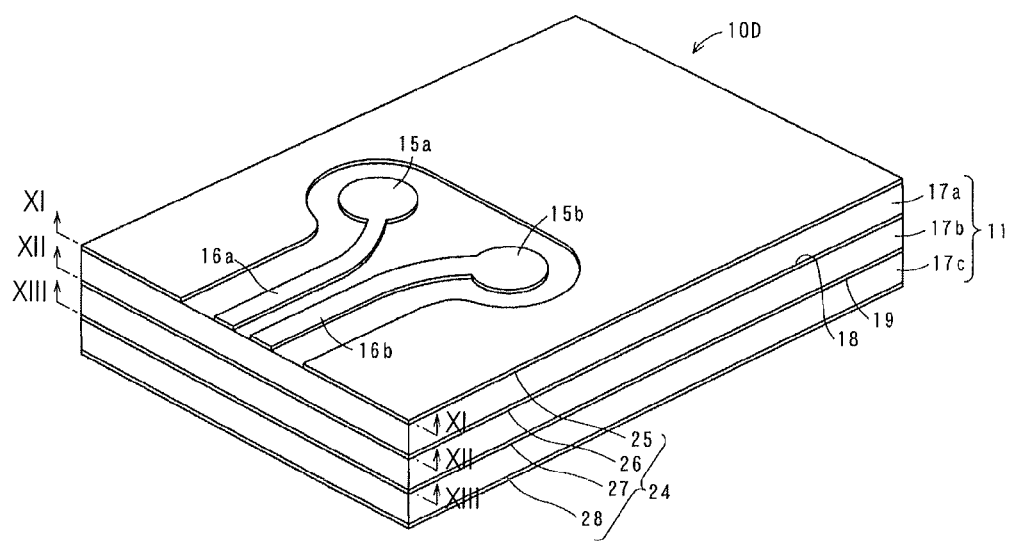
FIG. 9 illustrates a schematic external perspective view of a wiring board according to one embodiment.
Figure 10:
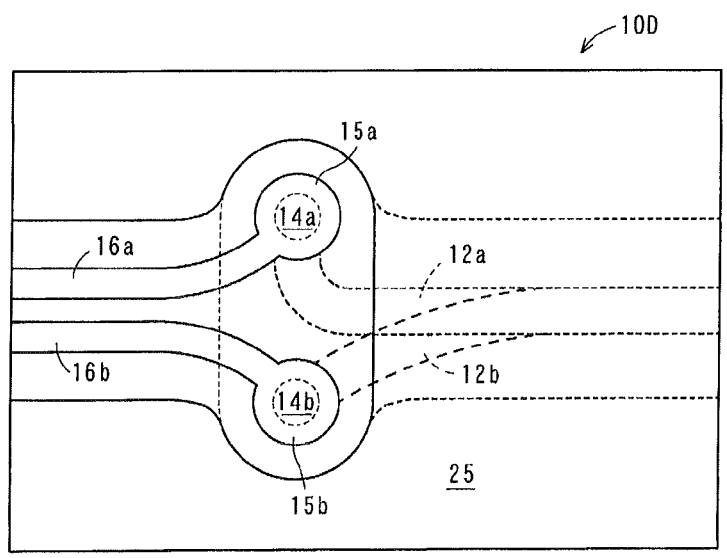
FIG. 10 illustrates a schematic top plan view of the wiring board shown in FIG. 9.
Figure 11:
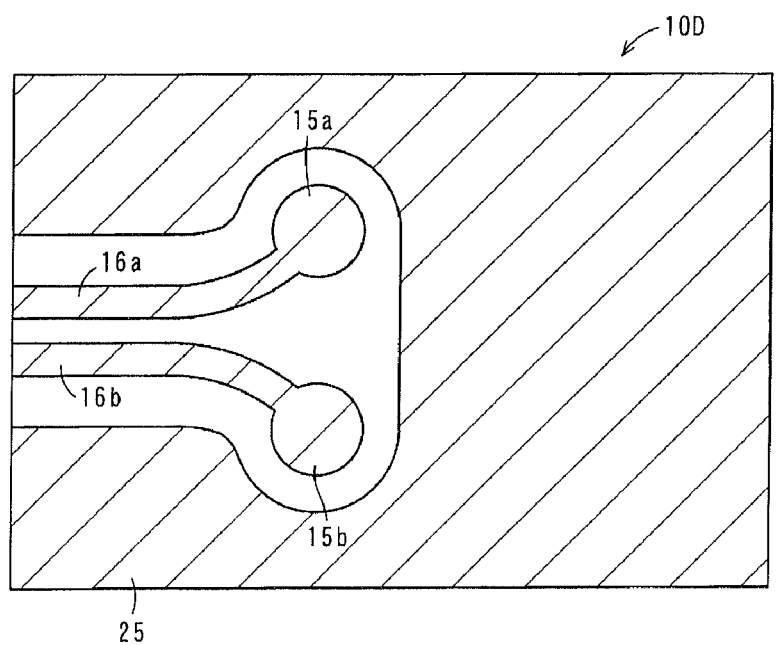
FIG. 11 illustrates a schematic cross sectional view in a line XI-XI in FIG. 9.
Figure 12:
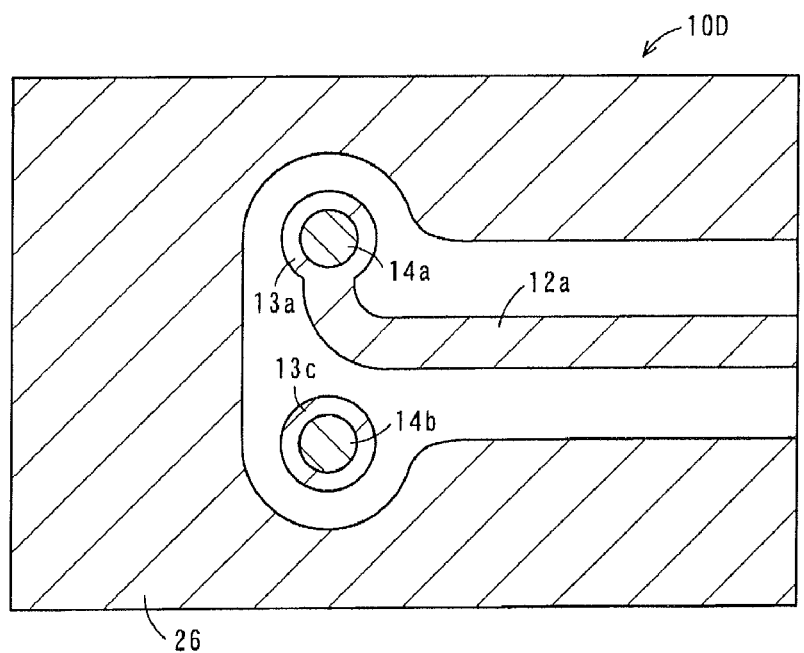
FIG. 12 illustrates a schematic cross sectional view in a line XII-XII in FIG. 9.
Figure 13:
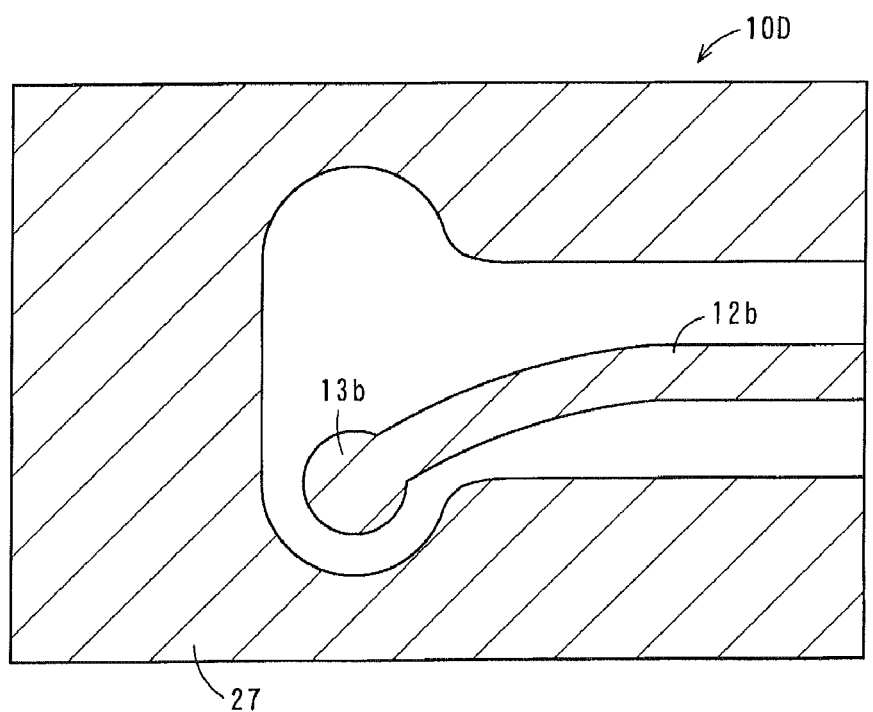
FIG. 13 illustrates a schematic cross sectional view in a line XIII-XIII XIII in FIG. 9.

FIG. 9 is a perspective view showing the wiring board 10D of according to an embodiment of the invention. FIG. 10 is a plan view showing the wiring board 10D of FIG. 9. FIG. 11 is a cross sectional view showing the wiring board 10D shown in FIG. 9 taken along the line XI-XI of FIG. 9. FIG. 12 is a cross sectional view showing the wiring board 10D shown in FIG. 9 taken along the line XII-XII of FIG. 9. FIG. 13 is a cross sectional view showing the wiring board 10D shown in FIG. 9 taken along the line XIII-XIII of FIG. 9. The wiring board of this embodiment further includes a ground conductor 24 as compared with the wiring board 10.

The wiring board 10D is configured to further include first to fourth ground conductor layers 25 to 28 that function as the ground conductor 24. With reference to FIGS. 9 to 11, the first ground conductor layer 25 is provided along the first main surface 11a of the dielectric substrate 11 in the thickness direction Z. The first ground conductor layer 25 is provided to cover the pair of surface layer line conductors 16a, and 16b from the outer side. The second ground conductor layer 26 is provided along the upper surface 18 of the intermediate layer 17b. With reference to FIG. 12, the second ground conductor layer 26 is provided to cover the first line conductor 12a from the outer side. The third ground conductor layer 27 is provided along the lower surface 09 of the intermediate layer 17b. With reference to FIG. 13 the third ground conductor layer 27 is provided to cover the second line conductor 12b from the outer side. With reference to FIG. 9, the fourth ground conductor layer 28 is provided along the second main surface 11b of the dielectric substrate 11 in the thickness direction Z. The ground conductor 24 can be formed by using a material and a construction method similar to those in the case of the aforementioned line conductors.

Since each ground conductor layer 25 to 28 is respectively provided to cover each line conductor in this manner, leakage of the high frequency wave signal transmitted by the line conductor to an exterior portion can be restrained. Herewith, even when another differential line is provided, mutual interference can be restrained. Further, the fourth ground conductor layer 28 can function as an electrode for external connection for inputting/outputting an electric signal to and from and for supplying power source to an electronic component mounted on the wiring board 10D.

Figure 14:
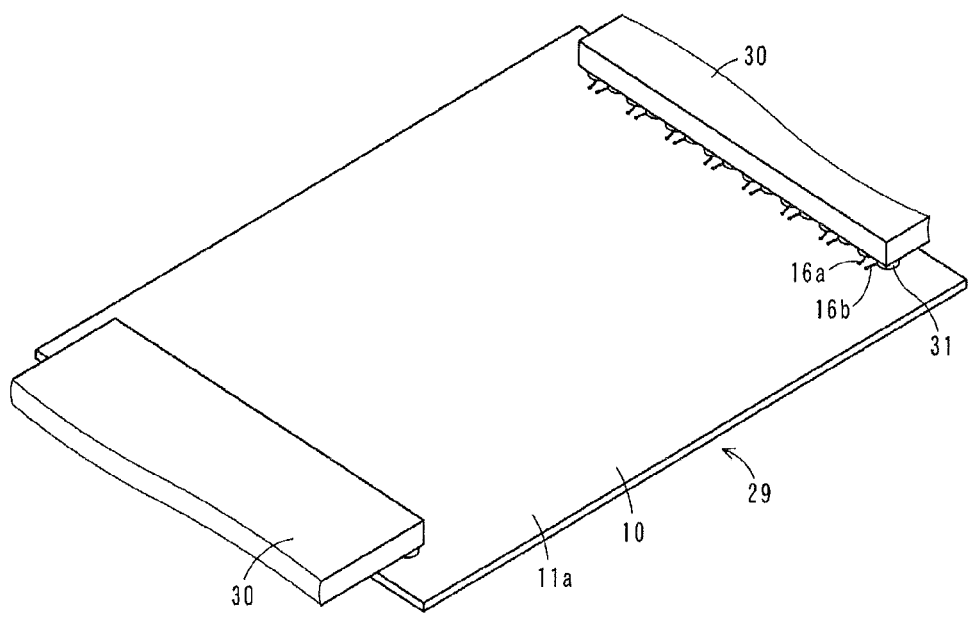
FIG. 14 illustrates an external perspective view of an electrical signal transmission system according to one embodiment.
Figure 15:
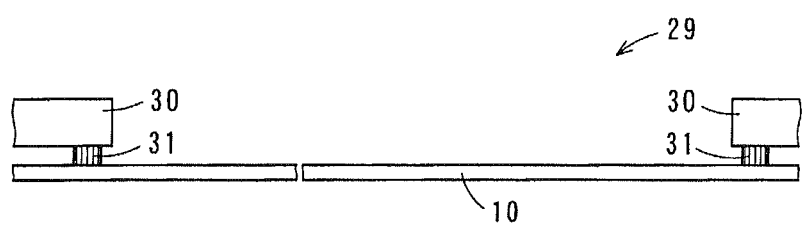
FIG. 15 illustrates a schematic elevation plan view of the electrical signal transmission system shown in FIG. 14.
Figure 16:
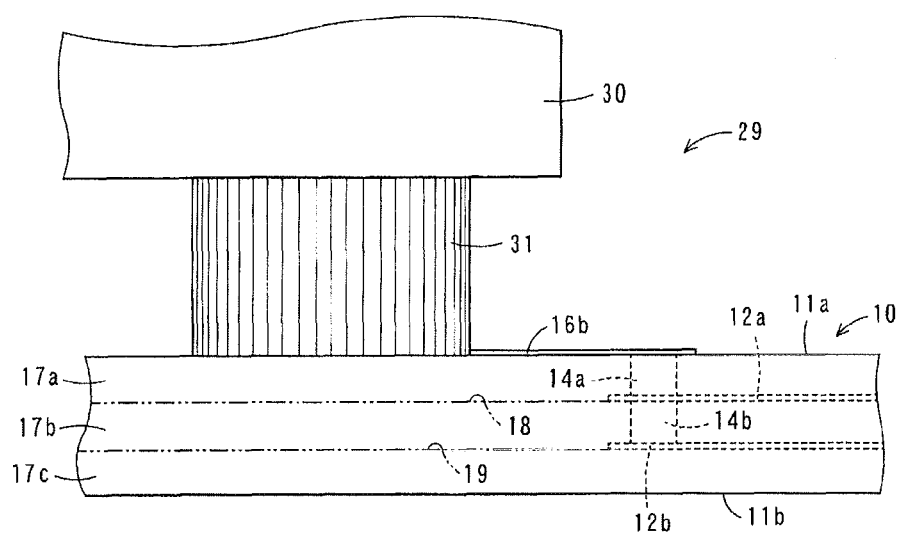
FIG. 16 illustrates a schematic enlarged elevation plan view of the part of the electrical signal transmission system shown in FIG. 15.

FIG. 14 is a perspective view showing the electric signal transmission system 29 of according to an embodiment of the invention. FIG. 15 is a front view showing the electric signal transmission system 29. FIG. 16 is an enlarged front view showing a part of the electric signal transmission system 29 shown in FIG. 15. In this embodiment, the wiring board 10 of the first embodiment is employed. In this embodiment, the electric signal transmission system 29 is constituted to include the wiring board 10 having eight inner layer line conductors 12a, 12b, and a semiconductor integrated circuit 30 mounted on the wiring board 10. The wiring board 10 may be any of the wiring boards 10A, 10B, 10C, 10D, 1E, 10F.

The semiconductor integrated circuit 30 can be operated at high speed, and can be mounted on the upper surface 18 of the wiring board 10. The semiconductor integrated circuit 30 may comprise, for example but without limitation, a semiconductor element such as an integrated circuit (IC), large scale integration (LSI), and the like, and an optical semiconductor element such as a semiconductor laser (LD), a photo diode (PD), and the like. The semiconductor integrated circuit 30 can be electrically connected with surface layer line conductors 16a and 16b via a conductor bump constituted by solder, gold (Au), or the like or the electrode pad 31 for connecting the semiconductor integrated circuit 30. Accordingly, an electric signal of high quality can be transmitted to the semiconductor integrated circuit 30 from the wiring board 10.

Further, embodiments of the invention may be provided by an electronic apparatus equipped with the electric signal transmission system 29. The electronic apparatus may comprise, for example but without limitation, a personal computer, a game apparatus, a mobile phone, a graphic board, a server, and the like. The electronic apparatuses are equipped with a semiconductor integrated circuit used in an especially high frequency band. The electronic apparatuses may comprise, an electronic apparatus equipped with the semiconductor integrated circuit used in the frequency band of at least 10 GHz. Generally, when such a semiconductor integrated circuit is included, deterioration of electric signal caused by transmission becomes large in proportion to the frequency band. However, with the electronic apparatus of according to an embodiment of the invention, since the wiring board is also included, deterioration of electric signal cause by transmission can be restrained. Accordingly, electric signal of high quality can be transmitted even in the case of such a frequency condition.

In each of the embodiments of the invention, influence to electrical length by the three inner layer lands 13a to 13c is ignored, and the electrical lengths are equally set by the line lengths of the pair of inner layer line conductors 12a and 12b and the pair of penetration conductors 14a and 14b. If the three inner layer lands 13a to 13c are set to have shapes with which influence to the electrical lengths becomes equal, influence of the three inner layer lands 13a to 13c can be ignored and calculation of the electrical lengths can be simplified.

In each of the embodiments of the invention, the cross sectional shape and the size of the pair of inner layer line conductors 12a and 12b are equal to each other without limitation. However, at least any one of the line length and the width may be set so that the electrical lengths become equal.

In each of the embodiments of the invention, the cross sectional shape of the pair of inner layer line conductors 12a and 12b may be, for example but without limitation, rectangular shape, circular shape, square shape, ellipse shape, and the like.

In each of the embodiments of the invention, the dielectric substrate 11 comprises at least three dielectric layers 17a to 17c. The dielectric substrate 11 may comprise any suitable structure. Further, the dielectric substrate 11 is not limited to have the structure in which dielectric layers are laminated and any structure may be employed such that the pair of inner layer line conductors 12a and 12b is provided in the dielectric substrate 11, and the pair of inner layer line conductors 12a and 12b is provided on surfaces that function as the first virtual plane and the second virtual plane.

Hereinafter, an example and a comparative example will be described. In the example and comparative example, a phase difference between the lines of the differential line respectively designed is analyzed by using a finite element method. Note that the analysis condition of the finite element method was in the frequency band of 0 to 40 GHz.

Example

The differential line constituted by the two lines shown in FIG. 1 is designed by using a substrate, line conductors (hereinafter, referred to as inner layer wirings) in the substrate, line conductors of a substrate surface layer (hereinafter, surface layer wirings), and via conductors 14a and 14b.

The relative permittivity of the substrate was 4.2, and the thickness of the substrate was 0.334 mm. Further, the substrate was covered with a solder resist whose thickness was 0.025 mm.

The line width of each of the inner layer line conductors 12a and 12b was 0.05 mm, the thickness of each of the inner layer line conductors 12a and 12b was 0.011 mm, and the distance between the inner layer line conductors 12a and 12b was 0.104 mm. Further, the line width of each of the surface layer line conductors 16a and 16b wiring was 0.063 mm, the thickness of each of the surface layer line conductors 16a and 16b was 0.015 mm, and the distance between the lines was 0.05 mm. Further, the diameter of each of the via conductors 14a and 14b was 0.1 mm, and the diameter of the land was 0.18 mm. Under these conditions, the line lengths of the inner layer line conductors 12a and 12b are adjusted so that the electrical lengths of each of the differential lines 32 become equal.

Then, the phase difference between the differential lines of the example is calculated in the frequency band of 0 to 40 GHz.

Comparative Example

As the comparative example, a differential line 32 was designed under the same conditions as the embodiment shown in FIG. 1 except the inner layer wiring. Instead of the inner layer wiring 12a of FIG. 1, the inner layer wiring was designed to have the same line length as 12b and to be symmetric with the inner layer wiring 12b when viewed from the upper side.

Figure 17:
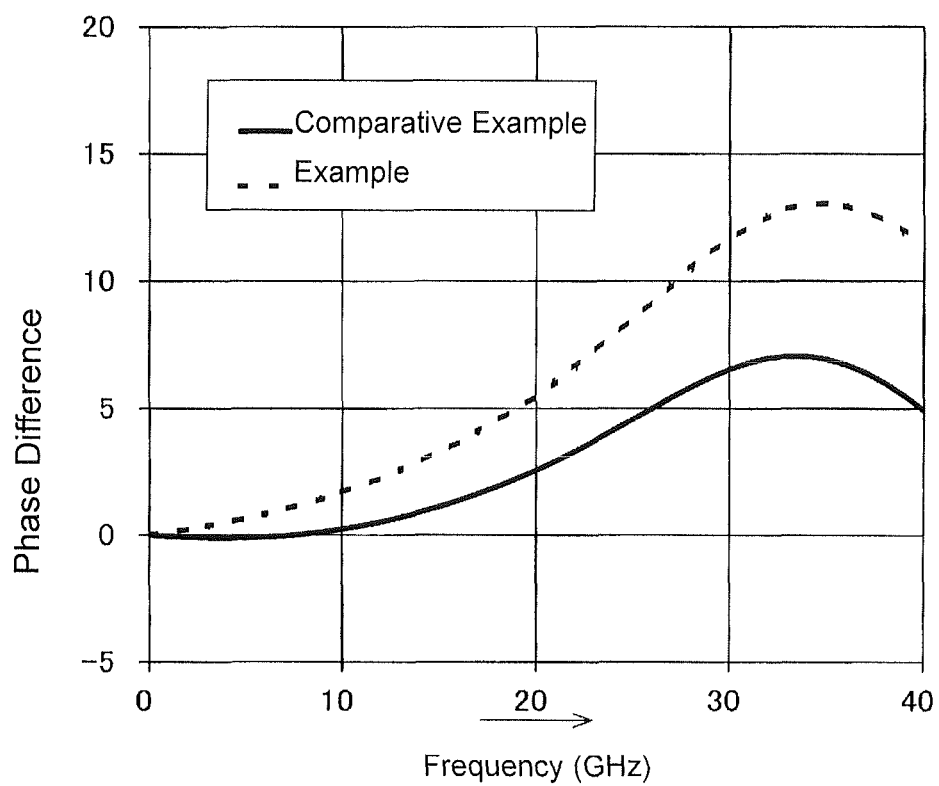
FIG. 17 is a graph showing a frequency dependency property of the phase difference obtained in an exemplary example and in a comparative example.

FIG. 17 shows frequency dependency property of the phase difference obtained in the example and the comparative example. The vertical axis shows phase difference, and the horizontal axis shows frequency.

According to the data of FIG. 17, when the frequency was not less than 2 GHz in the comparative example, a phase difference was generated. However, the phase difference of the differential line was virtually not generated in the example. Further, in the frequency range of 0 to 40 GHz, the maximum phase difference of the differential line of the example was 7 degrees. The value is small and not less than 5% of the pulse width, corruption of the pulse wave is small when compared with 13 degrees which is the maximum phase difference of the differential line of the comparative example, and increase of skew is restrained.

While at least one exemplary embodiment has been presented in the foregoing detailed description, the present invention is not limited to the above-described embodiment or embodiments. Variations may be apparent to those skilled in the art. In carrying out the present invention, various modifications, combinations, sub-combinations and alterations may occur in regard to the elements of the above-described embodiment insofar as they are within the technical scope of the present invention or the equivalents thereof. The exemplary embodiment or exemplary embodiments are examples, and are not intended to limit the scope, applicability, or configuration of the invention in any way. Rather, the foregoing detailed description will provide those skilled in the art with a template for implementing the exemplary embodiment or exemplary embodiments. It should be understood that various changes can be made in the function and arrangement of elements without departing from the scope of the invention as set forth in the appended claims and the legal equivalents thereof. Furthermore, although embodiments of the present invention have been described with reference to the accompanying drawings, it is to be noted that changes and modifications may be apparent to those skilled in the art. Such changes and modifications are to be understood as being included within the scope of the present invention as defined by the claims.

Terms and phrases used in this document, and variations hereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The invention claimed is:
1. A wiring board comprising:
a dielectric substrate;

a first line comprising a first line conductor formed in the dielectric substrate and a first via conductor formed from one end of the first line conductor to a first main surface of the dielectric substrate; and a second line comprising:
  a second line conductor formed in the dielectric substrate, a part of the second line conductor being aligned with the first line conductor,
  an electric signal having opposite phase to an electric signal supplied to the first line conductor being supplied to the second line conductor, and
  a second via conductor formed from one end of the second line conductor to the first main surface of the dielectric substrate, the second via conductor being longer than the first via conductor, an electrical length of the second line being equal to an electrical length of the first line.

2. The wiring board according to claim 1, wherein:
the first line further comprises a first surface layer line conductor provided along the first main surface of the dielectric substrate,
the second line further comprises a second surface layer line conductor provided along the first main surface of the dielectric substrate, a part of the second surface layer line conductor being aligned with the first surface layer line conductor,
one end of the first surface layer line conductor is electrically coupled to the first via conductor, and
one end of the second surface layer line conductor is electrically coupled to the second via conductor.

3. The wiring board according to claim 1, wherein an electrical length of the first line conductor is larger than an electrical length of the second line conductor.

4. The wiring board according to claim 1, wherein:
the first line conductor comprises a first line parallel portion and a residual first line separation portion, a center line of the first line conductor being parallel to a center line of the second line conductor in the first line parallel portion,
one end of the residual first line separation portion is electrically coupled to the first via conductor,
the second line conductor comprises a second line parallel portion and a residual second line separation portion, the center line of the first line conductor being parallel to a center line of the second line conductor in the second line parallel portion,
one end of the residual second line separation portion is electrically coupled to the second via conductor,
an electrical length of the first line parallel portion is equal to an electrical length of the second line parallel portion, and
an electrical length of the first line separation portion is larger than an electrical length of the second line separation portion.

5. The wiring board according to claim 4, wherein:
a total electrical length of the first line separation portion and the first via conductor, and
a total length of the second line separation portion and the second via conductor are equal.

6. The wiring board according to claim 2, wherein:
an electrical length of the first surface layer line conductor is larger than an electrical length of the second surface layer line conductor, and
an electrical length of the first line conductor is smaller than an electrical length of the second line conductor.

7. The wiring board according to claim 6, wherein the first via conductor is provided at the first main surface side of the second line conductor at a distance from the second line conductor.

8. The wiring board according to claim 2, wherein a center line of at least a part of the first surface layer conductor is parallel to a center line of at least a part of the second surface layer line conductor.

9. An electric signal transmission system comprising:
a wiring board comprising:
  a dielectric substrate;
  a first line comprising:
    a first line conductor formed in the dielectric substrate and a first via conductor formed from one end of the first line conductor to first main surface of the dielectric substrate; and
    a first surface layer line conductor provided along the first main surface of the dielectric substrate, one end of the first surface layer line conductor is electrically coupled to the first via conductor;
  a second line comprising:
    a second line conductor formed in the dielectric substrate, a part of the second line conductor being aligned with the first line conductor,
    an electric signal having opposite phase to an electric signal supplied to the first line conductor being supplied to the second line conductor, and
    a second via conductor formed from one end of the second line conductor to the first main surface of the dielectric substrate, the second via conductor being longer than the first via conductor, an electrical length of the second line being equal to an electrical length of the first line;
  a second surface layer line conductor provided along the first main surface of the dielectric substrate, a part of the second surface layer line conductor being aligned with the first surface layer line conductor, one end of the second surface layer line conductor is electrically connected to the second via conductor; and
a semiconductor integrated circuit electrically coupled to the first surface layer line conductor and the second surface layer line conductor.

10. The electric signal transmission system of claim 9, wherein the semiconductor integrated circuit is used in a frequency band of at least 10 GHz.

11. The wiring board according to claim 9, wherein an electrical length of the first line conductor is larger than an electrical length of the second line conductor.

12. The wiring board according to claim 9, wherein:
the first line conductor comprises a first line parallel portion and a residual first line separation portion, a center line of the first line conductor being parallel to a center line of the second line conductor in the first line parallel portion,
one end of the residual first line separation portion is electrically coupled to the first via conductor,
the second line conductor comprises a second line parallel portion and a residual second line separation portion, a center line of the first line conductor being parallel to the center line of the second line conductor in the second line parallel portion,
one end of the residual second line separation portion is electrically coupled to the second via conductor,
an electrical length of the first line parallel portion is equal to an electrical length of the second line parallel portion, and an electrical length of the first line separation portion is larger than an electrical length of the second line separation portion.

13. The wiring board according to claim 12, wherein:
a total electrical length of the first line separation portion and the first via conductor, and
a total length of the second line separation portion and the second via conductor are equal.

14. The wiring board according to claim 9, wherein:
an electrical length of the first surface layer line conductor is larger than an electrical length of the second surface layer conductor, and
an electrical length of the first line conductor is smaller than an electrical length of the second line conductor.

15. The wiring board according to claim 14, wherein the first via conductor is provided at the first main surface side of the second line conductor at a distance from the second line conductor.

16. The wiring board according to claim 9, wherein a center line of at least a part of the first surface layer conductor is parallel to a center line of at least a part of the second surface layer line conductor.

* * * * *